(12) United States Patent
Ooishi et al.

(10) Patent No.: US 6,940,767 B2
(45) Date of Patent: Sep. 6, 2005

(54) SEMICONDUCTOR MEMORY DEVICE HAVING A PLURALITY OF SIGNAL LINES FOR WRITING AND READING DATA

(75) Inventors: Tsukasa Ooishi, Hyogo (JP); Hiroaki Tanizaki, Hyogo (JP)

(73) Assignees: Renesas Technology Corp., Tokyo (JP); Mitsubishi Electric Engineering Company Limited, Tokyo (JP)

(*) Notice: Subject to any disclaimer, the term of this patent is extended or adjusted under 35 U.S.C. 154(b) by 144 days.

(21) Appl. No.: 10/209,884

(22) Filed: Aug. 2, 2002

(65) Prior Publication Data

US 2003/0048680 A1 Mar. 13, 2003

(30) Foreign Application Priority Data

Sep. 7, 2001 (JP) ....................................... 2001-272236

(51) Int. Cl.[7] ............................... G11C 7/00; G11C 8/00
(52) U.S. Cl. .................. 365/201; 365/189.09; 365/191; 365/196; 365/230.06
(58) Field of Search ................................ 365/201, 191, 365/189.09, 196, 230.06, 226

(56) References Cited

U.S. PATENT DOCUMENTS

| | | | | |
|---|---|---|---|---|
| 5,305,261 A | * | 4/1994 | Furutani et al. | ........ 365/189.01 |
| 5,305,267 A | * | 4/1994 | Haraguchi et al. | .......... 365/201 |
| 5,373,472 A | * | 12/1994 | Ohsawa | ...................... 365/201 |
| 5,537,073 A | * | 7/1996 | Arimoto | ..................... 327/546 |
| 5,732,022 A | * | 3/1998 | Kato et al. | ............. 365/185.24 |
| 5,847,597 A | * | 12/1998 | Ooishi et al. | ................ 327/543 |
| 6,686,747 B2 | * | 2/2004 | Morgan | ...................... 324/600 |
| 2002/0003732 A1 | * | 1/2002 | Ohtani et al. | ................ 365/201 |
| 2002/0085445 A1 | * | 7/2002 | Itou | ....................... 365/230.06 |
| 2002/0101774 A1 | * | 8/2002 | Nakamura et al. | .......... 365/207 |
| 2002/0149988 A1 | * | 10/2002 | Ishikawa et al. | ............ 365/226 |
| 2002/0196074 A1 | * | 12/2002 | Kanda et al. | ................ 327/541 |
| 2003/0009713 A1 | * | 1/2003 | Endou | ........................ 714/724 |

FOREIGN PATENT DOCUMENTS

| JP | 2003016800 A | * | 1/2003 | ........... G11C/29/00 |
|---|---|---|---|---|
| JP | 2003045200 A | * | 2/2003 | ........... G11C/29/00 |

OTHER PUBLICATIONS

K. Kanda et al., "Abnormal Leakage Suppression (ALS) Scheme for Low Standby Current SRAMs", ISSCC 2001, pp. 174–175.

* cited by examiner

*Primary Examiner*—Hoai Ho
*Assistant Examiner*—Ly Duy Pham
(74) *Attorney, Agent, or Firm*—McDermott Will & Emery LLP

(57) ABSTRACT

A write-driver/read-amplifier circuit includes a write driver, a GIO equalize circuit and a read amplifier. When a current leaks from or to global data line, a signal applied to a logic gate attains L-level. As a result, the write driver and the GIO equalize circuit stop the operations so that a semiconductor memory device can prevent occurrence of an unnecessary leak current.

5 Claims, 14 Drawing Sheets

SEMICONDUCTOR MEMORY DEVICE HAVING A PLURALITY OF SIGNAL LINES FOR WRITING AND READING DATA

BACKGROUND OF THE INVENTION

1. Field of the Invention

The present invention relates to a semiconductor memory device, and particularly to a semiconductor memory device having a plurality of signal lines for writing and reading data.

2. Description of the Background Art

In recent years, capacities of semiconductor memory devices such as dynamic random access memories have been increased. As a result, faults may occur in memory cells in a manufacturing step. Also, faults may occur in signal lines such as word lines, bit lines and data lines. In a conventional manner, defects in such signal lines are externally detected by a tester from outside the semiconductor memory device.

In recent years, however, signal lines in semiconductor memory devices have been subminiaturized for increasing capacities of the semiconductor memory devices. According to a fault detecting method using an external tester, therefore, it is difficult to detect faults finely by checking signal lines one by one.

Even when a faulty signal line having a fault is detected, a faulty leak current will continuously flow if the faulty signal line is short-circuited to another line or the like. For example, it is assumed that a global data line pair is precharged to H-level in the write or read operation. If short circuit occurs between paired global data lines, the faulty global data line pair is replaced with a preliminary or spare global data line pair so that it is possible to avoid use of the faulty global data line pair. However, the faulty global data line pair will be continuously precharged. Therefore, the faulty leak current will continuously flow.

SUMMARY OF THE INVENTION

An object of the invention is to provide a semiconductor memory device, which allows easy and fine detection of a faulty signal line, and further can reduce a faulty leak current.

A semiconductor memory device according to the invention has a test mode, and includes a memory cell array, a plurality of signal lines, a test signal generating circuit, a potential supply circuit and a determining circuit. The memory cell array includes a plurality of memory cells. The plurality of signal lines are employed for selecting a specific memory cell from the plurality of memory cells and operating to write and read data. The test signal generating circuit generates a test signal in the test mode. The potential supply circuit supplies a predetermined potential to the plurality of signal lines in response to the test signal. The determining circuit determines whether the plurality of signal lines hold the predetermined potential or not.

According to this semiconductor memory device, therefore, it is possible to determine by the internal circuits whether a current leaking from or to a signal line is present or not. Accordingly, the presence/absence of a fault on the signal lines can be determined more easily and more finely than the case of using a tester for externally detecting a fault.

A semiconductor memory device according to the invention includes a memory cell array, a plurality of signal lines, potential supply circuits, a plurality of I/O lines, a redundant determining circuit, a shift redundant circuit and a potential supply operation stop circuit. The memory cell array includes a plurality of memory cells. The signal lines are employed for selecting a specific memory cell from the plurality of memory cells and operating to write and read data. The potential supply circuits are provided corresponding to the plurality of signal lines for supplying a predetermined potential to the corresponding signal lines, respectively. The I/O lines are employed for inputting and outputting a signal to and from said signal lines. The redundant determining circuit is employed for outputting a shift signal specifying a faulty signal line among the plurality of signal lines. The shift redundant circuit switches connection between the I/O line and the signal line in response to the shift signal for replacing the faulty signal line with the neighboring signal line. The potential supply operation stop circuit stops the operation of the potential supply circuit corresponding to the faulty signal line in response to the shift signal.

Accordingly, the semiconductor memory device stops the supply of a potential to the faulty signal line flowing a leak current. As a result, it is possible to prevent the current leak.

According to the invention, it is possible to determine presence/absence of a fault on a signal line in the semiconductor memory device by internal circuits without using an external tester. Further, the semiconductor memory device can stop a function of a write-driver/read-amplifier circuit connected to the faulty global data line pair. Thereby, occurrence of an unnecessary leak current can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described in greater detail with reference to the drawings. The same or corresponding portions bear the same reference numbers in the figures, and description thereof is not repeated.

[First Embodiment]

Figure 1:
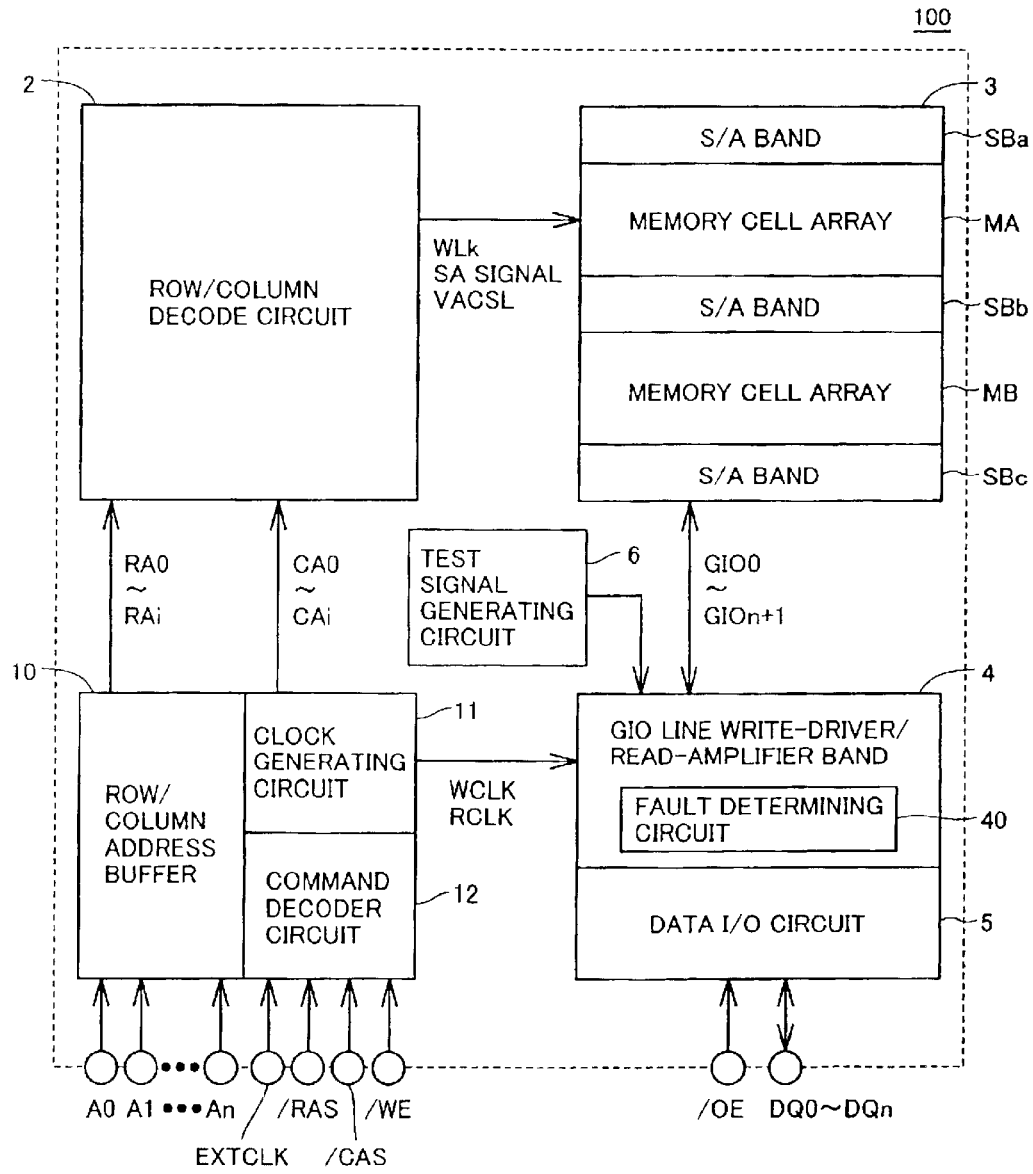
FIG. 1 is a block diagram showing a whole configuration of a semiconductor memory device of a first embodiment of the invention.

FIG. 1 is a block diagram showing a whole configuration of a semiconductor memory device 100 of a first embodiment of the invention.

Referring to FIG. 1, a semiconductor memory device 100 includes a row/column address buffer 10 taking in address signals A0–An, a clock generating circuit 11 which receives an external clock signal EXTCLK, and generates a clock signal determining timing of an internal operation, and a command decoder 12 which generates an internal control signal in response to an external control signal.

Row/column address buffer 10 predecodes a row-related address signal, and outputs row address signals RA0–RAi. Further, row/column address buffer 10 predecodes a column-related address signal to output column address signals CA0–CAi.

Clock generating circuit 11 generates, an internal clock signal int.CLK, a write clock signal WCLK for a write operation and a read clock RCLK for a read operation.

Command decoder 12 receives a row address strobe signal/RAS, a column address strobe signal/CAS and a write enable signal/WE, and outputs a signal for controlling the whole of semiconductor memory device 100.

Semiconductor memory device 100 further includes a row/column decoder circuit 2 and a memory unit 3.

Row/column decoder circuit 2 decodes row address signals RA0–RAi to output a word line activating signal WLk and a sense amplifier activating signal SA. Row/column decoder circuit 2 also decodes column address signals CA0–CAi to output a column select signal VACSL for selecting a column.

A memory unit 3 includes memory cell arrays MA and MB each including a plurality of memory cells arranged in rows and columns, word lines corresponding to the rows and bit lines corresponding to the columns, and also includes sense amplifier (S/A) bands SBa, SBb and SBc arranged on the opposite sides of memory cell arrays.

Semiconductor memory device 100 further includes a write-driver/read-amplifier band 4 and a data I/O circuit 5.

Write-driver/read-amplifier band 4 includes a write driver for transferring externally received data to a write line, and a read amplifier for amplifying read data received from the memory cell array via a read line.

Further, write-driver/read-amplifier band 4 includes a fault determining circuit 40 for detecting a fault on the write line.

Data I/O circuit 5 controls write-driver/read-amplifier band 4, externally outputs read data and inputs externally supplied write data.

Data I/O circuit 5 is connected for signal transmission to an/OE terminal receiving an output enable signal/OE and data I/O terminals inputting and outputting I/O data DQn.

Memory unit 3 and write-driver/read-amplifier band 4 transmit data via a read data line pair GIOR and a write data line pair GIOW.

Semiconductor memory device 100 further includes a test signal generating circuit 6. In a test mode, test signal generating circuit 6 generates a plurality of test signals to control various circuits in semiconductor memory device 100. Test signal generating circuit 6 may be a BIST (Built-In Self-Test) circuit.

Figure 2:
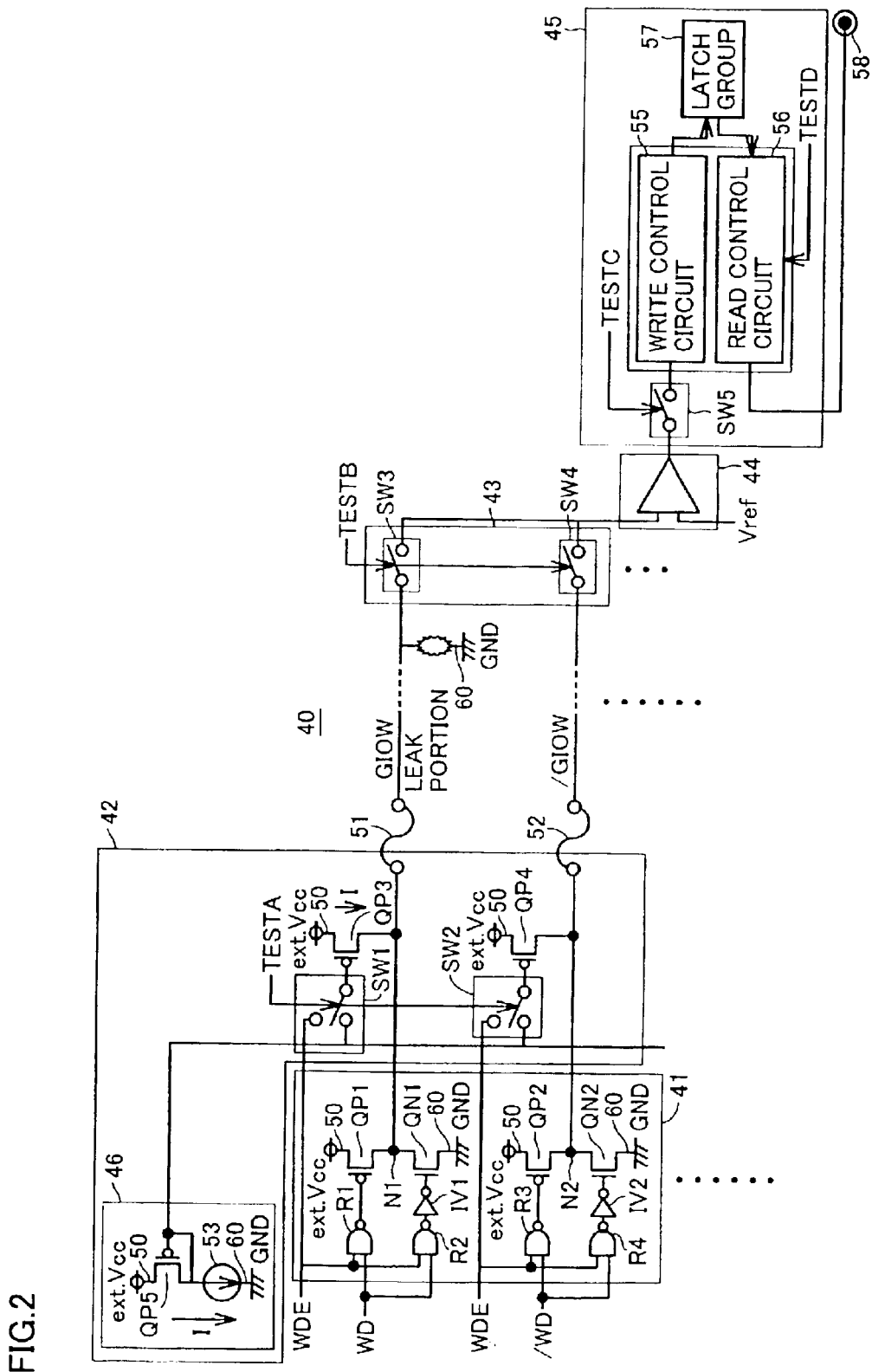
FIG. 2 is a block diagram showing a configuration of a fault determining circuit in a write-driver/read-amplifier band in FIG. 1.

FIG. 2 is a block diagram showing a configuration of fault determining circuit 40 in write-driver/read-amplifier band 4 shown in FIG. 1.

Referring to FIG. 2, fault determining circuit 40 includes a write driver 41, a potential supply circuit 42, a determination control circuit 43, a determining circuit 44 and a determination result storage circuit 45.

Write driver 41 includes logic gates R1–R4, inverters IV1 and IV2, P-channel MOS transistors QP1 and QP2, and N-channel MOS transistors QN1 and QN2.

Each of logic gates R1 and R2 receives a write data enable signal WDE and write date WD, and outputs a result of a NAND operation. Write data enable signal WDE is a signal for performing a write operation, and is output from command decoder 12. Inverter IV1 inverts an output signal of logic gate R2.

Transistors QP1 and QN1 are connected in series between an external power supply node 50 and a ground node 60. A gate of transistor QP1 receives the output signal of logic gate R1. A gate of transistor QN1 receives the output signal of inverter IV1. A connection node N1 between transistors QP1 and QN1 is connected to a write data line GIOW via a fuse element 51.

Each of logic gates R3 and R4 receives write data enable signal WDE and write data /WD, and outputs a result of a NAND operation. Write data /WD is an inverted signal of write data WD. Inverter IV2 inverts the output signal of logic gate R4.

Transistors QP2 and QN2 are connected in series between external power supply node 50 and ground node 60. A gate of transistor QP2 receives the output signal of logic gate R3. A gate of transistor QN2 receives the output signal of inverter IV2. A connection node N2 between transistors QP2 and QN2 is connected to a write data line/GIOW via a fuse element 52.

Potential supply circuit 42 includes switching elements SW1 and SW2, P-channel MOS transistors QP3 and QP4, and a reference current generating circuit 46.

Reference current generating circuit 46 includes a P-channel MOS transistor QP5 and a constant current supply 53.

Transistor QP5 and constant current supply 53 are connected in series between external power supply node 50 and ground node 60. A gate of transistor QP5 is connected to a drain thereof and switching elements SW1 and SW2.

Transistor QP3 is connected between external power supply node 50 and connection node N1. A gate of transistor QP3 is connected to switching element SW1.

Transistor QP4 is connected between external power supply node 50 and connection node N2. A gate of transistor QP4 is connected to switching element SW2.

Switching elements SW1 and SW2 receive a test signal TESTA generated from test signal generating circuit 6. When test signal TESTA is at H-level, switching element SW1 connects the gate of transistor QP3 to the gate of transistor QP5. When test signal TESTA is at L-level, switching element SW1 supplies write data enable signal WDE to the gate of transistor QP3.

When test signal TESTA is at H-level, switching element SW2 connects the gate of transistor QP4 to the gate of transistor QP5. When test signal TESTA is at L-level, switching element SW2 supplies write data enable signal WDE to the gate of transistor QP4.

FIG. 2 shows write driver 41 and potential supply circuit 42 connected to one write data line pair GIOW and /GIOW. In a structure employing a plurality of write data line pairs GIOW and /GIOW, each write data line pair GIOW and /GIOW is connected write driver 41 and potential supply circuit 42. However, only one reference current generating circuit 46 is required in potential Supply circuit 42 for all write data line pairs GIOW and /GIOW.

Determination control circuit 43 includes switching elements SW3 and SW4. Determination control circuit 43 receives a test signal TESTB from test signal generating circuit 6. Test signal TESTB periodically repeats H- and L-levels.

Determination control circuit 43 responds to test signal TESTB by turning on switching element SW3 and turning off switching element SW4 for a predetermined period. Thereby, determining circuit 44 is connected to write data line GIOW. After elapsing of the predetermined period, determination control circuit 43 turns off switching element 43, and turns on switching element SW4. Thereby, determining circuit 44 is connected to write data line /GIOW.

In a configuration including a plurality of write data line pairs GIOW and/GIOW, determination control circuit 43 includes switching elements SW each connected to write data line GIOW or /GIOW. Determination control circuit 43 responds to test signal TESTB by successively turning on switching elements SW each connected to one of the plurality of write data lines GIOW and /GIOW at a predetermined time intervals.

Determining circuit 44 is formed of a comparator. Determining circuit 44 compares a potential on write data line GIOW or /GIOW, which is connected to determining circuit 44 via determination control circuit 43, with a reference potential Vref generated from a reference potential generating circuit (not shown), and outputs a result of the comparison.

Determination result storage circuit 45 includes a switching element SW5, a write control circuit 55, a read control circuit 56 and a latch circuit group 57 including a plurality of latch circuits.

Switching elements SW5 is turned on when a test signal TESTC output from test signal generating circuit 6 is at H-level.

The determination result is applied from determining circuit 44 via write control circuit 55, and is stored in latch circuit group 57. Read control circuit 56 operates in response to a test signal TESTD output from test signal generating circuit 6. Read control circuit 56 controls an operation of the circuits, which are related to reading of internal data stored in latch circuit group 57, in the data read operation. The data read from read control circuit 56 is externally output from an external output terminal 47.

Fault determining circuit 40 having the foregoing circuit structure operates as follows.

Figure 3:
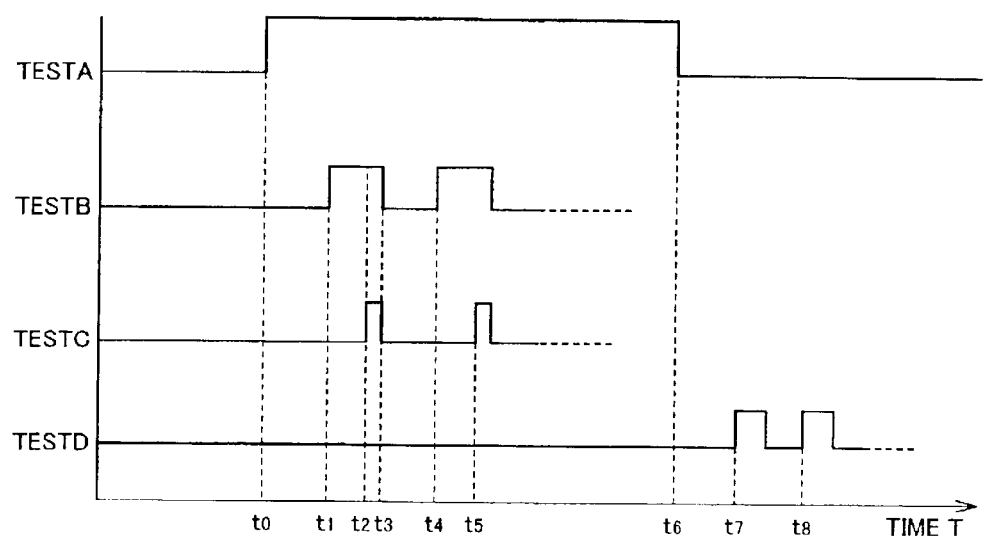
FIG. 3 is a timing chart representing a test signal output from a test signal generating circuit in an operation of a fault determining circuit.

FIG. 3 is a timing chart representing test signals TESTA-TESTD output from test signal generating circuit 6 during an operation of fault determining circuit 40.

Referring to FIG. 3, when semiconductor memory device 100 is in a normal operation at or before a time t0, test signal TESTA output from test signal generating circuit 6 is at L-level. Therefore, switching elements SW1 and SW2 in potential supply circuit 42 operate to apply write data enable signal WDE to both the gates of transistors QP3 and QP4. Transistors QP3 and QP4 operate as precharge transistors, and perform normal operations.

When test signal TESTA is activated to attain H-level at time t0, switching element SW1 connects the gate of transistor QP3 to the gate of transistor QP5 in reference current generating circuit 46. Further, switching element SW2 connects the gate of transistor QP4 to the gate of transistor QP5. In this state, transistor QP5 and transistors QP3 and QP4 form a current mirror. Therefore, transistors QP3 and QP4 supply a current I, which is equal to a current I flowing through reference current generating circuit 46, to write data lines GIOW and /GIOW, respectively. As a result, write data line pair GIOW and /GIOW is precharged to H-level.

Then, test signal TESTB generated from test signal generating circuit 6 becomes active to attain H-level at a time t1. Thereby, switching element SW3 in determination control circuit 43 is turned on. As a result, write data line GIOW is connected to determining circuit 44. For a period from time t1 to time t3, switching element SW3 is on so that determining circuit 44 compares the potential on write data line GIOW with reference potential Vref As a result of comparison, determining circuit 44 may detect current leaking from write data line GIOW to ground node 60, in which case determining circuit 44 outputs a signal at L-level.

While determining circuit 44 is determining presence/absence of the current leaking from or to write data line GIOW, test signal TESTC becomes active to attain H-level at a time t2. Therefore, switching element SW5 in determination result storage circuit 45 is turned on. As a result, a result of the determination about write data line GIOW, which is applied from determining circuit 44, is input to latch circuit group 57 via write control circuit 55.

When test signal TESTB attains L-level at time t3, switching element SW3 is turned off, and determining circuit 44 ends the determination of write data line GIOW. At the same time t3, test signal TESTC attains L-level. Therefore, switching element SW5 in determination result storage circuit 45 is turned off.

At a time t4, test signal TESTB attains H-level again so that determination control circuit 43 turns on switching element SW4 connected to write data line /GIOW. As a result, determining circuit 44 is connected to write data line /GIOW at time t4. Accordingly, determining circuit 44 determines presence/absence of current leaking from or to write data line /GIOW.

Subsequently, switching element SW5 in determination result storage circuit 45 is turned on at a time t5 to store the determination result in latch circuit group 57.

Through the operations described above, fault determining circuit 40 successively determines presence/absence of the current leaking from or to write data lines GIOW and /GIOW. All the determination result is stored in latch circuit group 57.

In the configuration including a plurality of write data line pairs GIOW and /GIOW, fault determining circuit 40 successively determines presence/absence of the current leaking from or to write data lines GIOW and /GIOW in response to a clock cycle of test signal TESTB.

When test signal TESTA attains L-level at a time t6, switching elements SW1 and SW2 in potential supply circuit 42 apply write data enable signal WDE to gates of both transistors QP3 and QP4, respectively. As a result, transistors QP3 and QP4 operate as precharge transistors, and perform a normal operation.

After the end of determination of the leak current, test signal TESTD output from test signal generating circuit 6 attains H-level at a time t7. Therefore, read control circuit 56 in determination result storage circuit 45 operates. Read control circuit 56 reads out the determination result of write data line GIOW from latch circuit group 57, and outputs the read data to an external output terminal 58. At a time t8 when test signal TESTD attains H-level again, read control circuit 56 reads the determination result of write data line /GIOW, and outputs it to external output terminal 58.

Through the above operations, fault determining circuit 40 can detect presence/absence of the current leaking from or to each write data line GIOW or /GIOW.

When it is determined by fault determining circuit 40 that a leak current flows from or to write data line GIOW, fuse element 51 is blown. Similarly, When it is determined by fault determining circuit 40 that a leak current flows from or to write data line /GIOW, fuse element 52 is blown.

[Second Embodiment]

In the first embodiment described above, write data lines GIOW and /GIOW are precharged to H-level when operating the faulty determining circuit.

In a second embodiment, write data lines GIOW and /GIOW are precharged to L-level when operating the faulty determining circuit, as described below.

Figure 4:
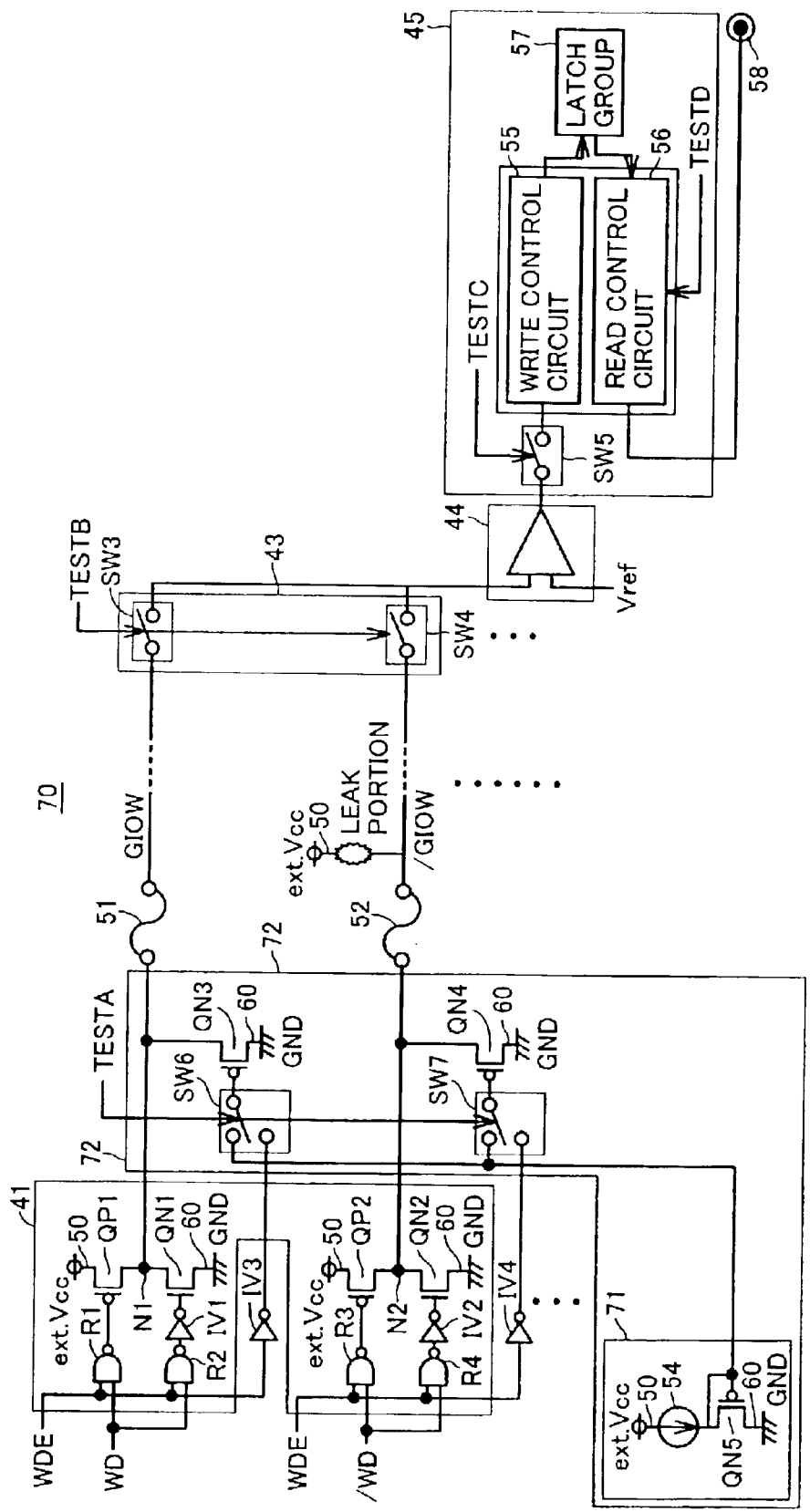
FIG. 4 is a block diagram showing a configuration of a fault determining circuit in a second embodiment of the invention.

FIG. 4 is a block diagram showing a configuration of the fault determining circuit in the second embodiment of the invention.

Referring to FIG. 4, a fault determining circuit 70 differs from fault determining circuit 40 shown in FIG. 2 in that a potential supply circuit 72 is employed instead of potential supply circuit 42. Further, inverters IV3 and IV4 are added.

Potential supply circuit 72 includes N-channel MOS transistors QN3 and QN4, switching elements SW6 and SW7, and a reference current generating circuit 71.

Reference current generating circuit 71 includes an N-channel MOS transistor QN5 and a constant current supply 54.

Transistor QN5 and constant current supply 54 are connected in series between external power supply node 50 and ground node 60. A gate of transistor QN5 is connected to a drain thereof as well as switching elements SW6 and SW7.

Transistor QN3 is connected between ground node 60 and connection node N1. A gate of transistor QN3 is connected to switching element SW6.

Transistor QN4 is connected between ground node 60 and connection node N2. A gate of transistor QN4 is connected to switching element SW7.

Switching elements SW6 and SW7 receive test signal TESTA generated from test signal generating circuit 6. When test signal TESTA is at H-level, switching element SW6 connects the gate of transistor QN3 to the gate of transistor QN5. When test signal TESTA is at L-level, switching element SW6 applies the output signal of inverter IV3 to the gate of transistor QN3. Inverter IV3 receives and inverts write data enable signal WDE for outputting the inverted signal.

When test signal TESTA is at H-level, switching element SW7 connects the gate of transistor QN4 to the gate of transistor QN5. When test signal TESTA is at L-level, switching element SW7 applies the output signal of inverter IV4 to the gate of transistor QN4. Inverter IV4 receives and inverts write data enable signal WDE for outputting the same.

Other configurations are the same as those shown in FIG. 2, and therefore description thereof is not repeated.

Description will now be given on an operation of fault determining circuit 70.

When test signal TESTA generated from test signal generating circuit 6 is at L-level, and thus in the normal mode, switching elements SW6 and SW7 in potential supply circuit 72 apply the output signals of inverters IV3 and IV4 to the gates of transistors QN3 and QN4, respectively. As a result, potential supply circuit 72 performs the normal operation in response to a write data enable signal.

When semiconductor memory device 100 enters the test mode, and test signal TESTA attains H-level, switching elements SW6 and SW7 connect the gates of transistors QN3 and QN4 commonly to the gate of transistor QN5. Since these transistors form a current mirror, both write data lines GLOW and /GIOW attain L-level. Operations, which are performed after test signal TESTA attains H-level, are the same as those of fault determining circuit 40.

Fault determining circuit 70 determines presence/absence of the current leak between write data line GIOE or /GIOW and external power supply node 50.

Through the operations described above, presence/absence of the leak current can be determined in the case where write data lines GIOW and /GIOW are precharged to L-level.

[Third Embodiment]

Figure 5:
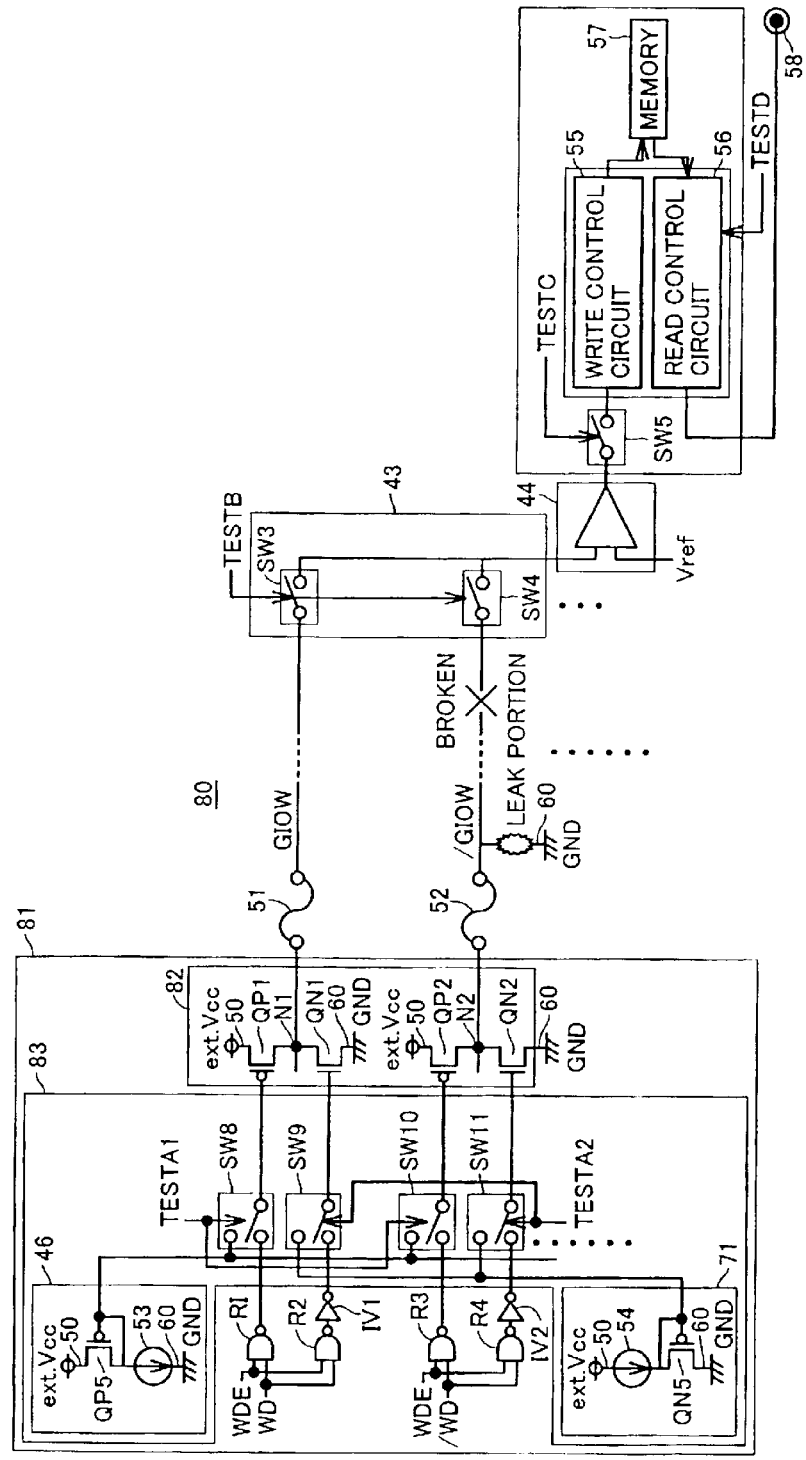
FIG. 5 is a block diagram showing a configuration of a fault determining circuit in a third embodiment of the invention.

FIG. 5 is a block diagram showing a configuration of a fault determining circuit 80 in a third embodiment of the invention.

Referring to FIG. 5, fault determining circuit 80 differs from fault determining circuit 40 shown in FIG. 2 in that a potential supply circuit 81 is employed instead of write driver 41 and potential supply circuit 42.

Potential supply circuit 81 includes a driver circuit 82, a transistor forced operation circuit 83, logic gates R1–R4, and inverters IV1 and IV2.

Driver circuit 82 includes P-channel MOS transistors QP1 and QP2 as well as N-channel MOS transistors QN1 and QN2.

Transistors QP1 and QN1 are connected in series between external power supply node 50 and ground node 60. The gate of transistor QP1 is connected to a switching element SW8. The gate of transistor QN1 is connected to a switching element SW9. Connection node N1 between transistors QP1 and QN1 is connected to write data line GIOW via fuse element 51.

Transistors QP2 and QN2 are connected in series between external power supply node 50 and ground node 60. The gate of transistor QP2 is connected to a switching element SW10. The gate of transistor QN2 is connected to a switching element SW11. Node N2 between transistors QP2 and QN2 is connected to write data line /GIOW via fuse element 52.

Transistor forced operation circuit 83 includes switching elements SW8–SW11 and reference current generating circuits 46 and 71.

Switching element SW8 is connected to the gate of transistor QP1, the gate of transistor QP5 in reference current generating circuit 46 and the output terminal of logic gate R1. Switching element SW8 receives a test signal TESTA1 generated from test signal generating circuit 6. When test signal TESTA1 is at H-level, switching element SW8 connects the gate of transistor QP1 to the gate of transistor QP5. When test signal TESTA1 is at L-level, switching element SW8 connects the gate of transistor QP1 to the output terminal of logic gate R1.

Switching element SW9 is connected to the gate of transistor QN1, the gate of transistor QN5 in reference current generating circuit 71 and the output terminal of inverter IV1. Switching element SW9 receives a test signal TESTA2 generated from test signal generating circuit 6.

When test signal TESTA2 is at H-level, switching element SW9 connects the gate of transistor QN1 to the gate of transistor QN5. When test signal TESTA2 is at L-level, switching element SW9 connects the gate of transistor QN1 to the output terminal of inverter IV1.

Switching element SW10 is connected to the gate of transistor QP2, the gate of transistor QP5 in reference current generating circuit 46 and the output terminal of logic gate R3. Switching element SW10 receives test signal TESTA1 generated from test signal generating circuit 6. When test signal TESTA1 is at H-level, switching element SW10 connects the gate of transistor QP2 to the gate of transistor QP5. When test signal TESTA1 is at L-level, switching element SW7 connects the gate of transistor QP2 to the output terminal of logic gate R3.

Switching element SW11 is connected to the gate of transistor QN2, the gate of transistor QN5 in reference current generating circuit 71 and the output terminal of inverter IV2. Switching element SW11 receives test signal TESTA2 generated from test signal generating circuit 6. When test signal TESTA2 is at H-level, switching element SW11 connects the gate of transistor QN2 to the gate of transistor QN5. When test signal TESTA2 is at L-level, switching element SW11 connects the gate of transistor QN2 to the output terminal of inverter IV2.

Fault determining circuit 80 having the foregoing circuit configuration operates as follows.

When test signal TESTA1 generated from test signal generating circuit 6 is at H-level, test signal TESTA2 is at L-level. Thereby, switching element SW8 connects transistors QP1 and QP5 together. Similarly, switching element SW10 connects transistors QP2 and QP5 together. Transistors QP1 and QP2 and transistor QP5 form a current mirror. As a result, both write data lines GIOW and /GIOW are precharged to H-level.

When test signal TESTA2 is at H-level, test signal TESTA1 is at L-level. Thereby, switching element SW9 connects transistors QN1 and QN5 together. Also, switching element SW11 connects transistors QN2 and QN5 together. As a result, both write data lines GIOW and /GIOW are precharged to L-level.

Through the operations described above, fault determining circuit 80 can determine the leak between write data line pair GIOW and /GIOW and the ground node, and can also determine the leak between write data line pair GIOW and /GIOW and the external power supply node.

Since the fault determining circuit uses the drivers commonly used by the transistors for precharge, the area occupied by the fault determining circuit can be reduced.

Figure 6:
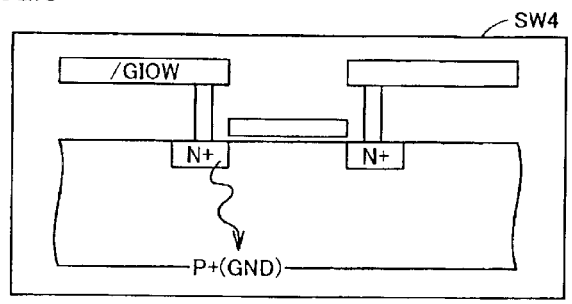
FIG. 6 is a cross section of a switching element in FIG. 5.

When write data line GIOW or /GIOW is broken, determination control circuit 43 serves to prevent occurrence of a floating node. As shown in FIG. 6, an end of write data line /GIOW is input to a PN junction of switching element SW4. In FIG. 5, therefore, even when write data line /GIOW precharged to H-level breaks, a reverse leak current at the PN junction of switching element SW4 prevents the floating state of broken write data line /GIOW.

The fault determining circuits of the first to third embodiments of the invention determine the presence/absence of the current leaking from or to the write data line pair. However, similar circuit structures may be employed for determining the presence/absence of the current leaking from or to the word lines.

[Fourth Embodiment]

Figure 7:
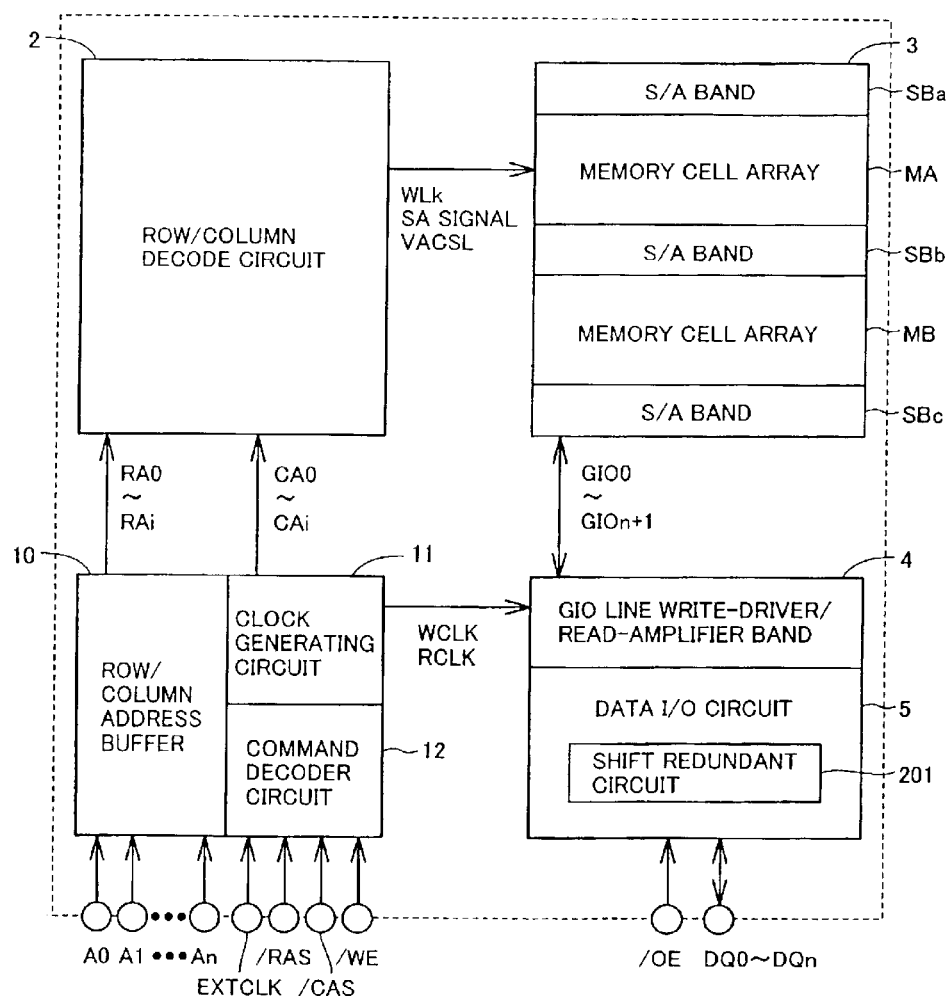
FIG. 7 is a block diagram showing a configuration of a semiconductor memory device in a fourth embodiment of the invention.

FIG. 7 is a block diagram showing a configuration of a semiconductor memory device 200 of a fourth embodiment of the invention.

Referring to FIG. 7, semiconductor memory device 200 includes row/column address buffer 10, clock generating circuit 11, command decoder 12 generating an internal control signal in accordance with an external control signal, row/column decoder circuit 2, memory portion 3, write-driver/read-amplifier band 4 and data I/O circuit 5.

Data I/O circuit 5 includes a shift redundant circuit 201. Shift redundant circuit 201 is a circuit for shifting a selected line such as a data line including a faulty memory cell, e.g., to a neighboring data line or the like. Description will now be given on shift redundant circuit 201.

Figure 8:
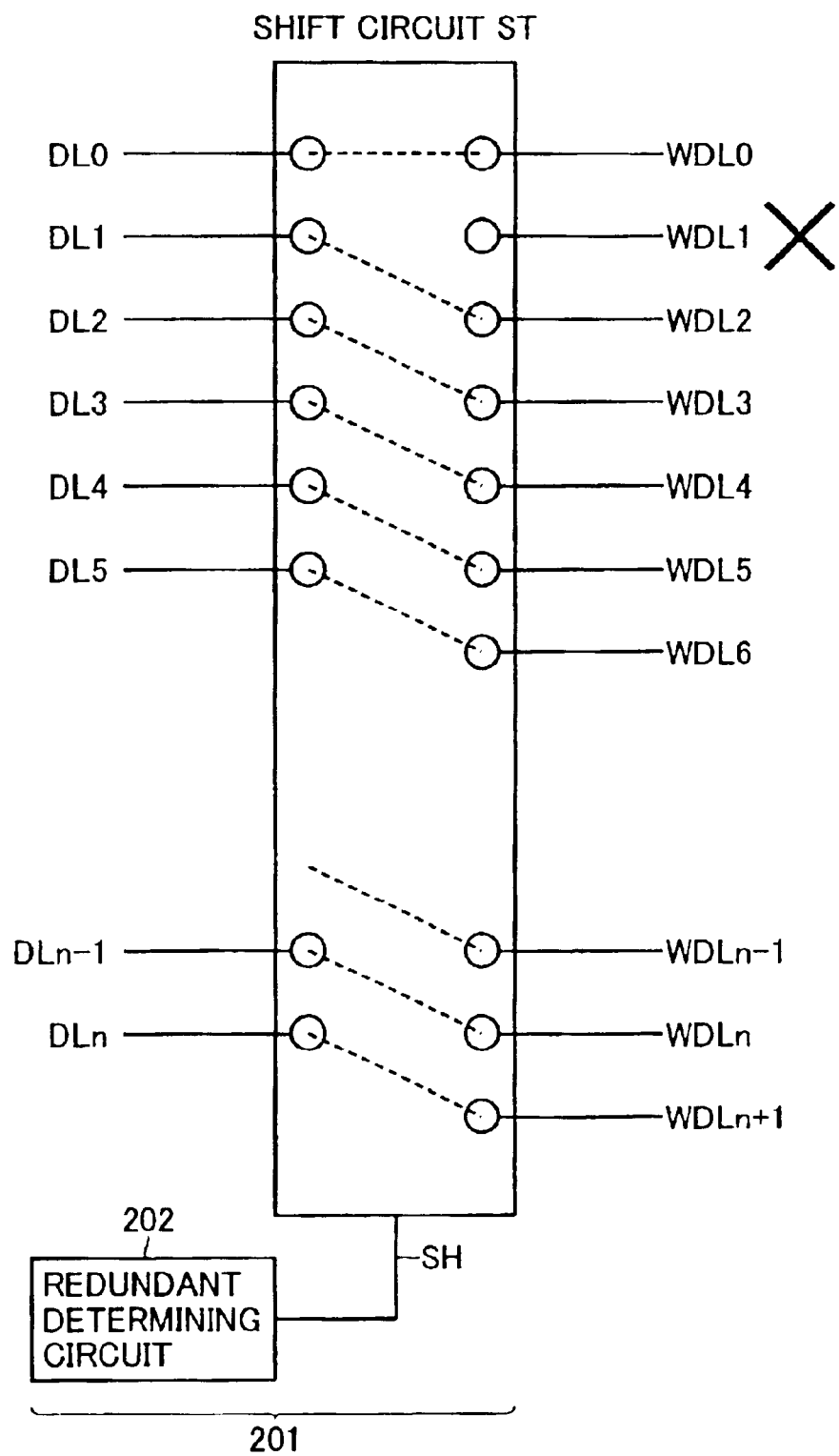
FIG. 8 is a diagram representing an operation of a shift redundant circuit for data lines.

FIG. 8 is a diagram showing an operation of a shift redundant circuit for the data lines.

Referring to FIG. 8, data lines DL0–DLn are connected to write data lines WDL0–WDLn via a shift circuit ST in shift redundant circuit 201. In FIG. 8, write data line WDLn+1 is a preliminary or spare write data line. Shift circuit ST receives a shift signal SH to start shifting. Shift signal SH is produced by redundant determining circuit 202.

It is now assumed that a fault occurs on write data line WDL1. Shift circuit ST receives a shift signal to disconnect data line DL1 from write data line WDL1, and also connects data line DL1 to write data line WDL2. Similarly, data line DL2 is connected to write data line WDL3, and data line DLn is connected to write data line WDLn+1.

Through the operations described above, shift redundant circuit 201 shifts the connection between the data lines when a faulty data line occurs. Thereby, the semiconductor memory device is repaired.

Description will now be given on a circuit configuration of the shift redundant circuit.

Figure 9:
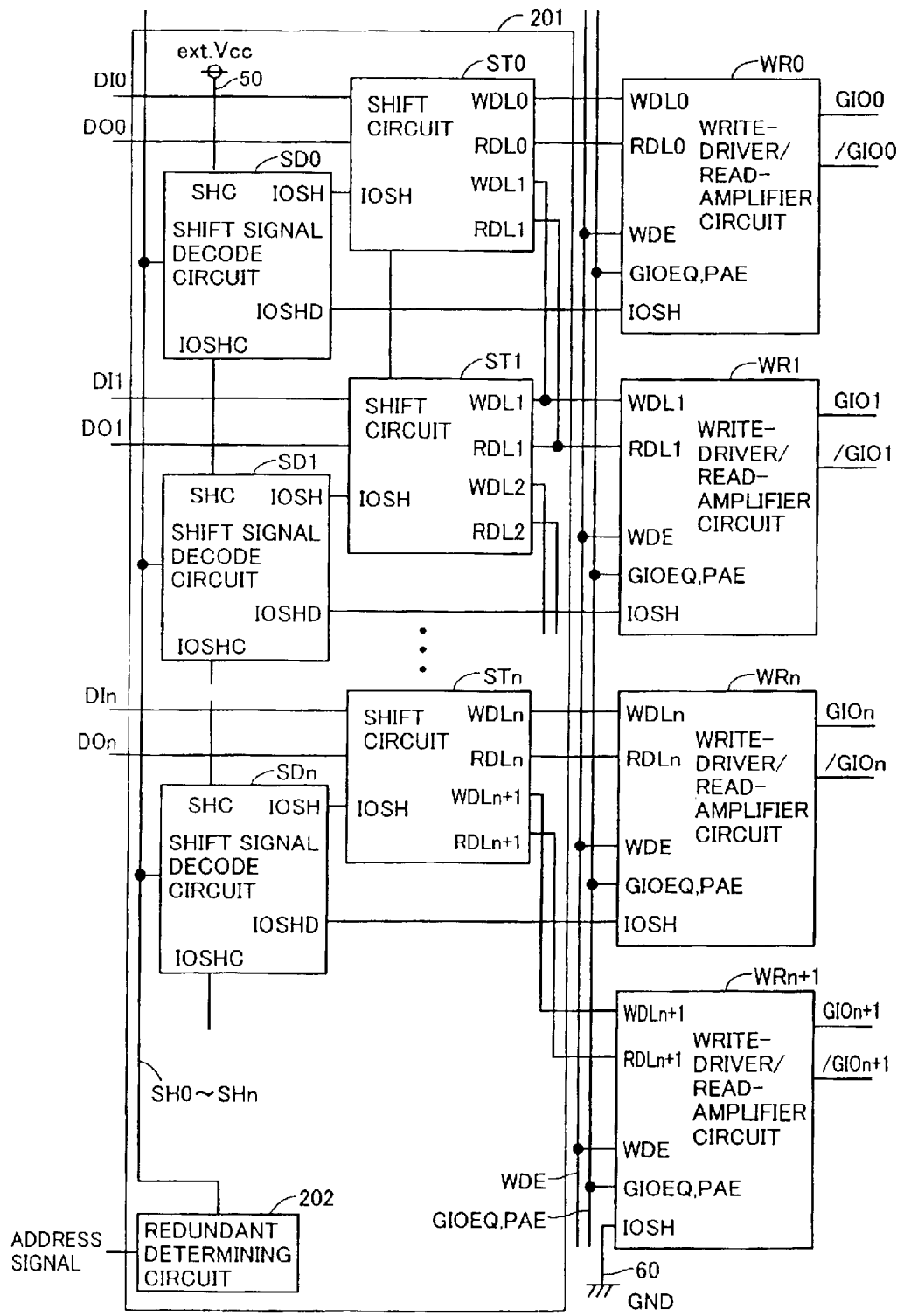
FIG. 9 is a block diagram specifically showing a configuration of a data I/O circuit.

FIG. 9 is a block diagram specifically showing a configuration of the data I/O circuit.

Referring to FIG. 9, data I/O circuit 5 includes write-driver/read-amplifier circuits WR0–WRn+1, and shift redundant circuit 201.

Shift redundant circuit 201 includes redundant determining circuit 202, shift signal decode circuits SD0–SDn, and shift circuits ST0–STn.

Data input signal line DI0 and data output signal line DO0 are connected to write data line WDL0 and read data line RDL0 via shift circuit ST0, respectively. Write data line WDL0 and read data line RDL0 are connected to global data line pair GIOn and /GIOn via write-driver/read-amplifier circuit WR0.

Likewise, data input signal line DIn (n: natural number) and data output signal line DOn are connected to write data line WDLn and read data line RDLn via shift circuit STn, respectively. Write data line WDLn and read data line RDLn are connected to global data line pair GIOn and /GIOn via write-driver/read-amplifier circuit WRn.

Redundant determining circuit 202 receives an address signal, specifies faulty global data line pair GIOn and /GIOn, and outputs shift signals SH0–SHn.

Shift signal decode circuit SDn receives shift signal SHn, and outputs a shift decode signal IOSH to shift circuit STn. Shift signal decode circuit SDn also outputs a signal IOSHC to shift signal decode circuit SDn+1. Further, shift signal decode circuit SDn outputs a signal ISOHD to write-driver/read-amplifier circuit WRn.

Figure 10:
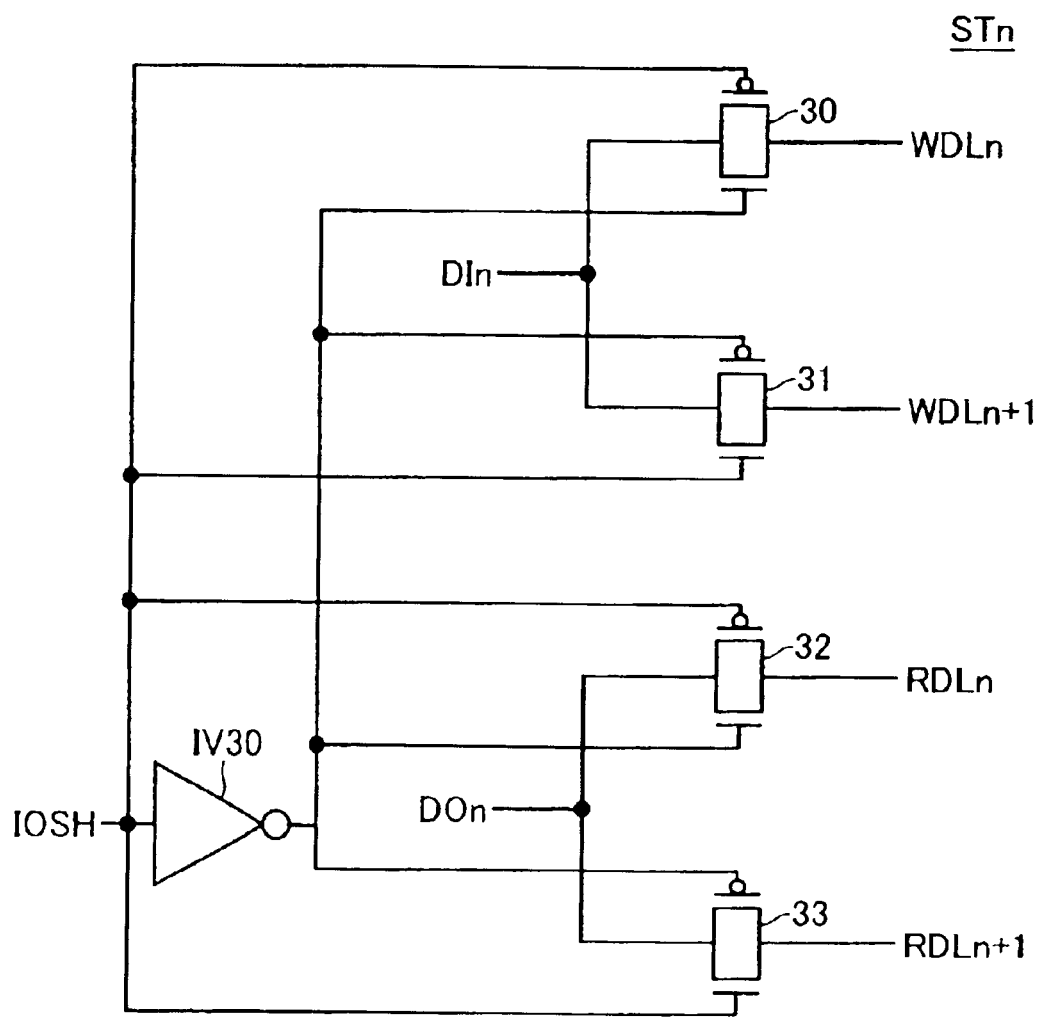
FIG. 10 is a circuit diagram showing a configuration of a shift circuit in FIG. 9.

FIG. 10 is a circuit diagram showing a configuration of the shift circuit shown in FIG. 9.

Referring to FIG. 10, shift circuit STn includes transfer gates 30–33 and an inverter IV30.

Each transfer gate is formed of a P-channel MOS transistor and an N-channel MOS transistor. An input terminal of transfer gate 30 is connected to data input line DIn, and an output terminal thereof is connected to write data line WDLn. In transfer gate 30, the P-channel MOS transistor receives shift decode signal IOSH on its gate, and the N-channel MOS transistor receives on its gate the output signal of inverter IV30. Inverter IV30 receives and inverts shift decode signal IOSH.

An input terminal of transfer gate 31 is connected to data input line DIn, and an output terminal thereof is connected to write data line WDLn+1. In transfer gate 31, the P-channel MOS transistor receives on its gate the output signal of inverter IV30, and the N-channel MOS transistor receives shift decode signal IOSH on its gate.

An input terminal of transfer gate 32 is connected to data output signal line DOn, and an output terminal thereof is connected to read data line RDLn. In transfer gate 32, the P-channel MOS transistor receives shift decode signal IOSH on its gate, and the N-channel MOS transistor receives on its gate the output signal of inverter IV30.

An input terminal of transfer gate 33 is connected to data output signal line DOn, and an output terminal thereof is connected to read data line RDLn+1. In transfer gate 33, the P-channel MOS transistor receives on its gate the output signal of inverter IV30, and the N-channel MOS transistor receives shift decode signal IOSH on its gate.

Figure 11:
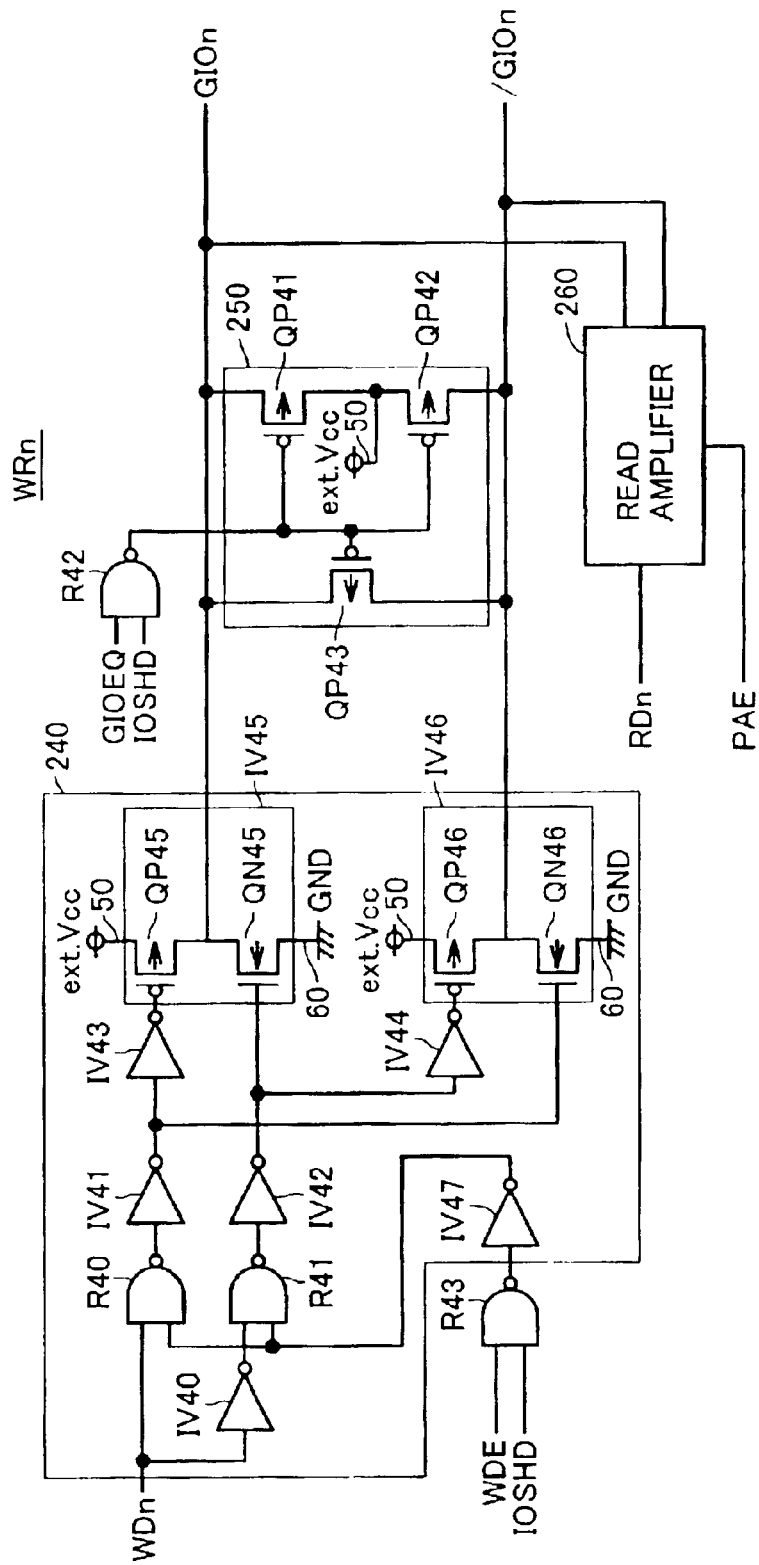
FIG. 11 is a circuit diagram showing a configuration of a write-driver/read-amplifier circuit in FIG. 9.

FIG. 11 is a circuit diagram showing a configuration of the write-driver/read-amplifier circuit in FIG. 9.

Referring to FIG. 11, write-driver/read-amplifier circuit WRn includes a write driver 240, a GIO equalize circuit 250, a read amplifier circuit 260, and logic gates R42 and R43.

Write driver 240 includes inverters IV40–IV47 and logic gates R40 and R41.

Logic gate R40 receives write data WDn on write gate line WDLn and the output signal of inverter IV47, and outputs a result of a NAND operation. The output terminal of logic gate R40 is connected to the input terminal of inverter IV41. Inverter IV41 receives and inverts the output signal of logic gate R40 for outputting the same. Logic gate R43 receives write data enable signal WRE and a signal IOSHD output from shift signal decode circuit SDn, and outputs a result of a NAND operation. An output terminal of logic gate R43 is connected to an input terminal of inverter IV47. Inverter IV47 receives and inverts the output signal of logic gate R43 for outputting the same.

Logic gate R41 receives the output signals of inverters IV40 and IV47, and outputs a result of a NAND operation. An output terminal of logic gate R41 is connected to an input terminal of inverter IV42. Inverter IV42 receives and inverts the output signal of logic gate R41 to output the inverted signal.

Inverter IV45 includes P- and N-channel MOS transistors QP45 and QN45, which are connected in series between external power supply node 50 and ground node 60. A gate of transistor QP45 is connected to an output terminal of inverter IV43. A gate of transistor QP45 is connected to an output terminal of inverter IV42. An input terminal of inverter IV43 is connected to an output terminal of inverter IV41. An output terminal of inverter IV45 is connected to global data line GIOn.

Inverter IV46 includes P- and N-channel MOS transistors QP46 and QN46, which are connected in series between external power supply node 50 and ground node 60. A gate of transistor QP46 is connected to an output terminal of inverter IV44. A gate of transistor QP46 is connected to the output terminal of inverter IV41. An input terminal of inverter IV44 is connected to the output terminal of inverter IV42. An output terminal of inverter IV46 is connected to global data line /GIOn.

GIO equalize circuit 250 includes P-channel MOS transistors QP41–QP43.

Transistors QP41 and QP42 are connected in series between global data lines GIOn and /GIOn. A connection node between transistors QP41 and QP42 is connected to external power supply node 50. Transistor QP43 is connected between global data lines GIOn and /GIOn. The gates of transistors QP41–QP43 are all connected to an output terminal of logic gate R42. Logic gate R42 receives a GIO equalize signal GIOEQ and signal IOSHD output from shift signal decode circuit SDn, and outputs a result of a NAND operation. GIO equalize signal GIOEQ is a signal for activating the GIO equalize circuit.

Read amplifier circuit 260 amplifies a minute potential difference between global data lines GIOn and /GIOn in response to activation of preamplifier enable signal PAE, and outputs a result of the amplification as read data RDn to read data line RDLn.

Figure 12:
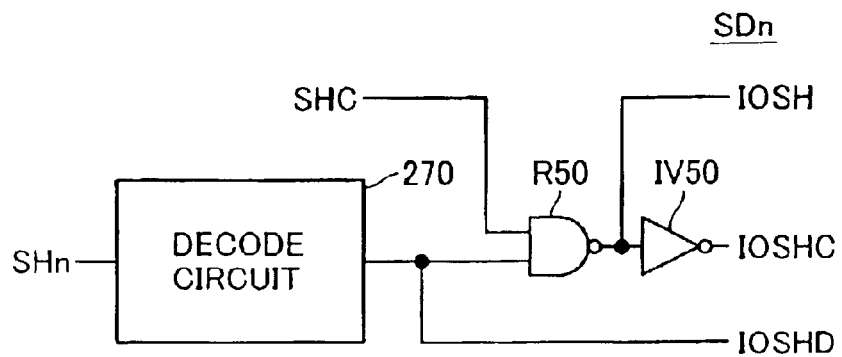
FIG. 12 is a circuit diagram showing a configuration of a shift signal decode circuit in FIG. 9.

FIG. 12 is a circuit diagram showing a configuration of shift signal decode circuit SDn in FIG. 9.

Referring to FIG. 12, shift signal decode circuit SDn includes a decode circuit 270, a logic gate R50 and an inverter IV50.

Decode circuit 270 receives shift signal SHn output from redundant determining circuit 202, and decodes the same for outputting signal IOSHD. Logic gate R50 receives signal IOSHD output from decode circuit 270 and a signal SHC output from shift signal decode circuit SDn–1, and outputs a result of a NAND operation as a signal IOSH. Inverter IV50 receives and inverts signal IOSH for outputting signal IOSHC.

Description will now be given on an operation of the data I/O circuit having the foregoing circuit configuration.

Figure 13:
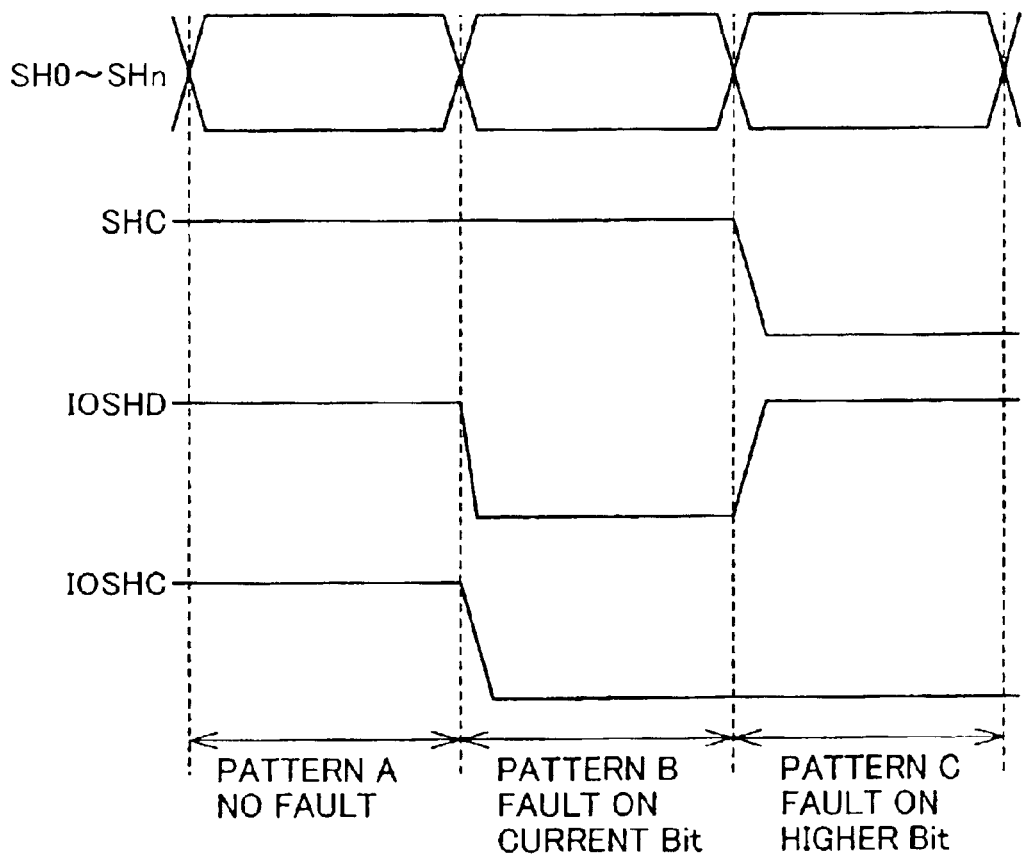
FIG. 13 is an operation waveform diagram representing an operation of a data I/O circuit in FIG. 9.

FIG. 13 is an operation waveform diagram representing an operation of data I/O circuit 5 shown in FIG. 9.

Referring to FIG. 13, an operation waveform pattern A represents a case where a faulty is not present on any global data lines pair GIO and /GIO. In this case, signal IOSHD output from decode circuit 270 in shift signal decode circuit SDn is at H-level. Signal SHC output from shift signal decode circuit SDn–1 is at H-level. Therefore, signal IOSH output from logic gate R50 is at L-level, and signal IOSHC is at H-level. As a result, shift circuit STn does not shift write and read data lines WDLn and RDLn. Write-driver/read-amplifier circuit WRn performs a normal operation in response to write data WD, write data enable signal WDE and others.

An operation waveform pattern B represents a case where a fault occurs on global data line pair GIOn or /GIOn. In this case, signal IOSHD output from decode circuit 270 in shift signal decode circuit SDn is at L-level. Therefore, signal IOSH output from logic gate R50 is at H-level. Also, the signal output from inverter IV50 is at L-level.

In accordance with signal IOSH at H-level, therefore, shift circuit STn shifts write and read data lines WDLn and RDLn. More specifically, shift circuit STn connects data input signal line DIn to write data line WDLn+1, and connects data output signal line DOn to read data line RDLn+1.

In write-driver/read-amplifier circuit WRn, signal IOSHD is at L-level so that the output signal of logic gate R43 is at H-level. Therefore, the output signals of both logic gates R40 and R41 are at H-level. As a result, all transistors QP45, QP46, QN45 and QN46 in inverters IV45 and IV46 are turned off.

As a result, global data lines GIOn and /GIOn are in a high-impedance state. Therefore, the current leak from or to faulty global line pair GIO and /GIO can be prevented.

An operation waveform pattern C represents a case where a fault occurs on higher global line pair GIO and /GIO (e.g., global line pair GIOn-1 and /GIOn-1). In this case, the signal output from decode circuit 270 in shift signal decode circuit SDn is at H-level, but signal SHC output from shift signal decode circuit SDn-1 is at L-level. Accordingly, signal IOSH output from logic gate R50 is at H-level, and signal IOSHC is at L-level.

In accordance with signal IOSH at H-level, therefore, shift circuit STn connects data input signal line DIn to write data line WDLn+1, and connects data output signal line DOn to read data line RDLn+1.

Since write-driver/read-amplifier circuit WRn receives signal IOSHD at H-level, it performs a normal operation.

Through the foregoing operations, shift signal decode circuit SDn and logic gates R42 and R43 stop the operations of write driver 240 and GIO equalize circuit 250 in write-driver/read-amplifier circuit WRn, which is connected to global line pair GIOn and /GIOn containing a fault. Accordingly, it is possible to prevent current leak from or to faulty global line pair GIOn and /GIOn. The shift redundant circuit can operate write-driver/read-amplifier circuits, which are connected to normal global line pairs GIOn and /GIOn, to perform the normal operation.

[Fifth Embodiment]

Figure 14:
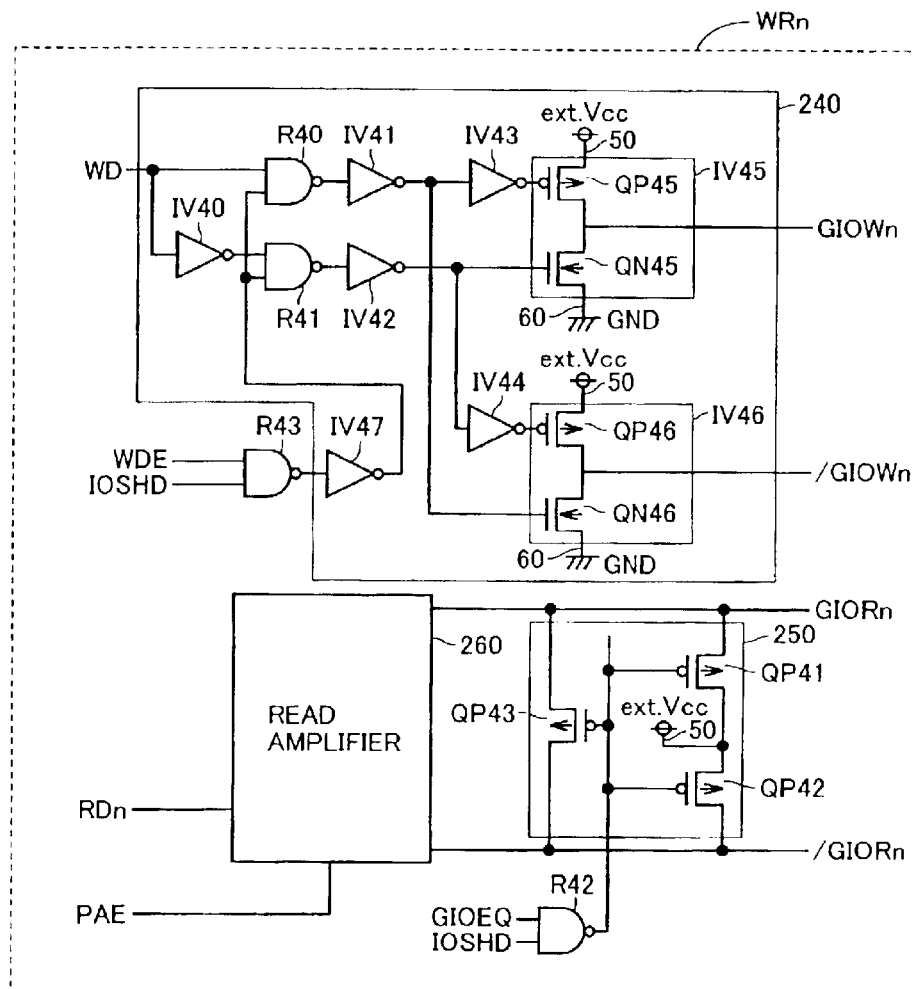
FIG. 14 is a circuit diagram showing a configuration of a write-driver/read-amplifier circuit in a fifth embodiment of the invention.

FIG. 14 is a circuit diagram showing a configuration of write-driver/read-amplifier circuit WRn in a fifth embodiment of the invention.

Referring to FIG. 14, write-driver/read-amplifier WRn includes write driver 240, GIO equalize circuit 250, logic gates R42 and R43, and read amplifier circuit 260.

In write driver 240, the output node of inverter IV45 is connected to write global data line GIOWn, and the output node of inverter IV46 is connected to write global data line /GIOWn. The output terminal of logic gate R43 is connected to the input terminal of inverter IV47 in write driver 240. GIO equalize circuit 250 and read amplifier 260 are connected to read global data line pair GIORn and /GIORn. The output terminal of logic gate R42 is connected to gates of transistors QP41–QP43 in equalize circuit 250.

Circuit configurations other than the above are the same as those in FIG. 11, and description thereof is not repeated. The operation of the write-driver/read-amplifier circuit shown in FIG. 14 is the same as that of write-driver/read-amplifier circuit in the fourth embodiment, and description thereof is not repeated.

According to the circuit structures described above, even when global data line pair GIO and /GIO is isolated from write global data line pair GIOW and /GIOW as well as read global data line pair GIOR and /GIOR, it is possible to prevent the current leak from or to faulty global data line pair GIO and /GIO.

[Sixth Embodiment]

Figure 15:
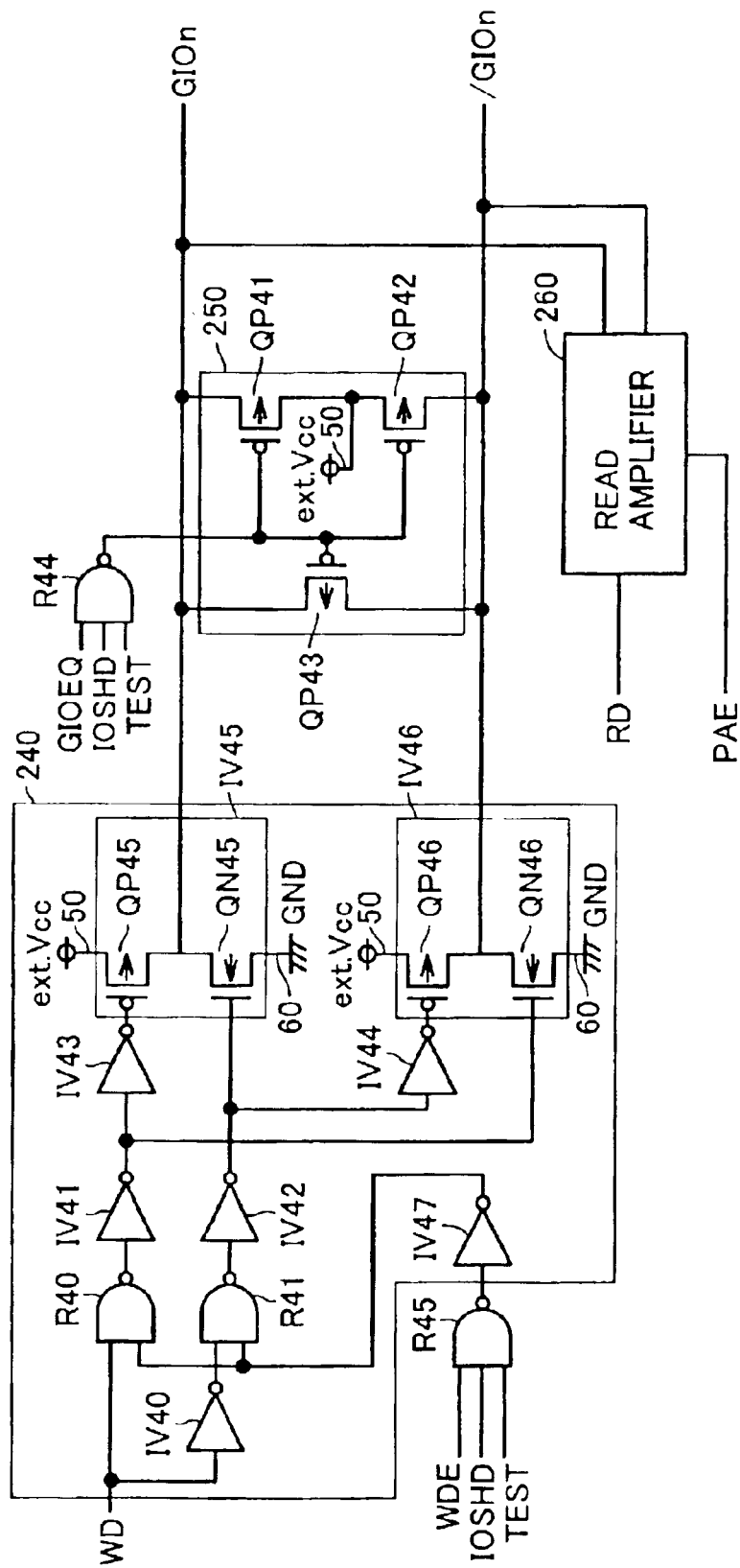
FIG. 15 is a circuit diagram showing a configuration of a write-driver/read-amplifier circuit in a sixth embodiment of the invention.

FIG. 15 is a circuit diagram showing a configuration of write-driver/read-amplifier circuit WRn in a sixth embodiment of the invention.

Referring to FIG. 15, write-driver/read-amplifier circuit WRn differs from that in FIG. 11 in that a logic gate R44 is arranged instead of logic gate R42, and a logic gate R45 is arranged instead of logic gate R45.

Logic gate R44 receives GIO equalize signal GIOEQ, signal IOSHD and test signal TEST, and outputs a result of a NAND operation. Test signal TEST in this embodiment is produced by command decoder 12.

Logic gate R45 receives write data enable signal WDE, signal IOSHD and test signal TEST, and outputs a result of a NAND operation.

Circuit configurations other than the above are the same as those shown in FIG. 11, and description thereof is not repeated.

Description will now be given on an operation of write-driver/read-amplifier circuit WRn having the foregoing circuit configuration.

In a normal operation, test signal TEST is at H-level. Therefore, write-driver/read-amplifier circuit WRn operates similarly to that in the fourth embodiment.

Description will now be given on an operation for detecting presence/absence of a faulty in global data line pair GIO and /GIO.

In this operation, test signal TEST attains L-level. As a result, the output signals of logic gates R44 and R45 attain H-level. Therefore, transistors QP45, QP46, QN45 and QN46 in inverters IV45 and IV46 as well as transistors QP41–QP43 in GIO equalize circuit 250 are turned off. Thus, logic gates R45 and R46 stop the operations of write driver 240 and GIO equalize circuit 250. Thereby, both global data lines GIOn and /GIOn in the pair attain the high-impedance state. In this state, test signal TEST applied to all write-driver/read-amplifier circuits WR0–WRn in data I/O circuit 5 attains L-level so that all global data line pairs GIO0 and /GIO0–GIOn+1 and /GIOn+1 attain the high-impedance state.

Accordingly, determination of presence/absence of a leak current can be immediately performed on all the global data line pairs. As a result, a cause of abnormal leak can be determined.

[Seventh Embodiment]

Figure 16:
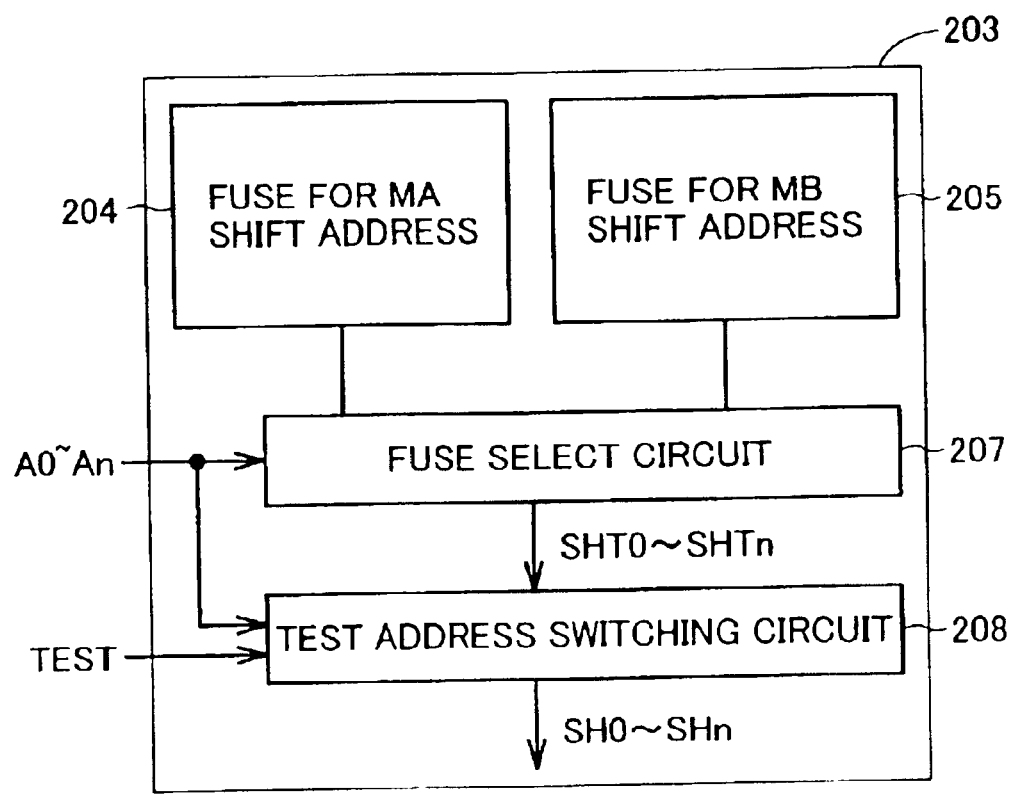
FIG. 16 is a circuit diagram showing a configuration of a redundant determining circuit in a seventh embodiment of the invention.

FIG. 16 is a circuit diagram showing a configuration of a redundant determining circuit in a seventh embodiment of the invention.

Referring to FIG. 16, a redundant determining circuit 203 includes a fuse 204 for the shift address in the memory cell array MA region, a fuse 205 for the shift address in the memory cell array MB region, a fuse select circuit 207 and a test address switching circuit 208.

Fuse 204 for the shift address in the memory cell array MA region and fuse 205 for the shift address in the memory cell array MB region are programmed in advance with shift manners for the case where a fault occurs on global data line pairs GIOn and /GIOn in the respective regions. Fuse select circuit 207 receives address signals A0–An, and selects fuse 204 or 205 used for the shift address and including the program data to be utilized as signals SHT0–SHTn.

Redundant determining circuit 203 further includes test address switching circuit 208. Test address switching circuit 208 receives test signal TEST, address signals A0–An, and signals SHT0–SHTn. When test signal TEST is inactive, test address switching circuit 208 outputs shift signals SHT0–SHTn as signals SH0–SHn. When test signal TEST becomes active, test address switching circuit 208 outputs address signals A0–An as shift signals SH0–SHn, respectively.

By redundant determining circuit 203 having the configurations described above, shift signals SHn can be controlled according to externally applied address signals A0–An. Therefore, global data line pairs GIO and /GIO can be selectively set to the high-impedance state, and presence/absence of the leak current can be detected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode, comprising:

a memory cell array including a plurality of memory cells;

a plurality of signal lines for selecting a specific memory cell from said plurality of memory cells and operating to write and read data;

a test signal generating circuit generating a test signal in said test mode;

a potential supply circuit supplying a predetermined potential to said plurality of signal lines in response to said test signal;

a determining circuit determining whether said plurality of signal lines hold said predetermined potential or not;

a determination control circuit connected between said plurality of signal lines and said determining circuit, said determination control circuit for selectively connecting said signal lines to said determining circuit in response to said test signal; and a determination result storage circuit storing a result of the determination by said determining circuit.

2. The semiconductor memory device according to claim 1, wherein said determination result storage circuit includes:

a storage circuit storing said result of the determination in response to said test signal; and a determination result reading circuit externally outputting said result of the determination stored in said storage circuit in response to said test signal.

3. The semiconductor memory device according to claim 1, wherein said predetermined potential is an external power supply potential.

4. The semiconductor memory device according to claim 1, wherein said predetermined potential is a ground potential.

5. A semiconductor memory device having a test mode, comprising:

a memory cell array including a plurality of memory cells;

a plurality of signal lines for selecting a specific memory cell from said plurality of memory cells and operating to write and read data;

a test signal generating circuit generating a test signal in said test mode;

a potential supply circuit supplying a predetermined potential to said plurality of signal lines in response to said test signal; and a determining circuit determining whether said plurality of signal lines hold said predetermined potential or not; wherein said potential supply circuit includes:

a driver including a first transistor connected between a power supply node and an output node connected to said signal line, and having a gate receiving a first signal, and a second transistor connected between said output node and a ground node, and having a gate receiving a second signal complementary to said first signal; and a transistor forced operation circuit selectively turning on said first and second transistors in response to said test signal.

* * * * *